United States Patent

Hamada et al.

[19]

[11] Patent Number: 6,106,635
[45] Date of Patent: Aug. 22, 2000

[54] WASHING METHOD AND WASHING APPARATUS

[75] Inventors: Satomi Hamada; Toshiro Maekawa, both of Kanagawa-ken, Japan

[73] Assignee: Ebara Corporation, Tokyo, Japan

[21] Appl. No.: 09/035,770

[22] Filed: Mar. 6, 1998

[30] Foreign Application Priority Data

Mar. 6, 1997 [JP] Japan ..................................... 9-069167

[51] Int. Cl.$^7$ ................ B08B 1/02; B08B 3/02; B08B 3/04
[52] U.S. Cl. ................ 134/33; 134/32; 134/34; 134/144; 134/902
[58] Field of Search ................ 134/32, 33, 34, 134/144, 902

[56] References Cited

U.S. PATENT DOCUMENTS 5,349,978   9/1994   Sago et al. ..................... 134/902 X
5,868,866   2/1999   Maekawa et al. ..................... 134/34

FOREIGN PATENT DOCUMENTS 8-52443   2/1996   Japan .
8-238463  9/1996   Japan .

OTHER PUBLICATIONS

U.S. Patent Application No. 08/609,686, filed Mar. 1, 1996, by Toshiro Maekawa, et al., Entitled "Method and Apparatus for Cleaning Workpiece", (Patent No. 5,868,866).

*Primary Examiner*—Zeinab El-Arini
*Attorney, Agent, or Firm*—Wenderoth, Lind & Ponack, L.L.P.

[57] ABSTRACT

A washing method provides a liquid jet washing by jetting a liquid against a rotating thin-plate-shaped workpiece from a nozzle which shifts while being positioned opposite a front or back surface of the workpiece, thus removing dust adhering to the front or back surface and thereby washing the workpiece. The locus of the shifting nozzle is caused to pass in the vicinity of, but not over, the center of rotation of the workpiece. Electronic circuitry present at the central portion of workpiece is prevented from suffering electrostatic breakage caused by collision with washing liquid. At the same time, an appropriate quantity of washing liquid is made to collide with the entire surface of a workpiece, so that the workpiece can be washed satisfactorily.

7 Claims, 3 Drawing Sheets

WASHING METHOD AND WASHING APPARATUS

BACKGROUND OF THE INVENTION

The present invention relates to a washing method for cleaning workpieces such as semiconductor wafers and the like, and to a washing apparatus for us in such washing method.

With advancements in the integration of semiconductor devices in recent years, wiring of circuits has become finer and wiring distances have become smaller. If dust greater in size than a wiring distance exists on a semiconductor substrate of such highly integrated semiconductor devices, short circuiting of wiring occurs. Accordingly, the allowable size of dust remaining on semiconductor wafers must be suppressed to be smaller than a wiring distance.

As a method for washing semiconductor wafers and the like, there have so far been disclosed a number of methods including a so-called scrubbing washing method or a method of scrubbing a surface of a semiconductor wafer with a nylon or mohair brush or the like or with a sponge of PVA (polyvinyl alcohol); an ultrasonic washing method or a method of jetting water endowed with ultrasonic vibration energy onto the surface of wafer and thereby cleaning off dust; a method of jetting cavitation-producing high-pressure water against a wafer to wash the wafer therewith, and a combination of these methods.

Now, in an ultrasonic washing method or a washing method using cavitation-producing high-pressure water, in order to jet water to the entire surface of a wafer, pure water is jetted toward a wafer from a nozzle a jetting hole of which is oriented to the surface of the wafer while the wafer is horizontally held and rotated at a predetermined number of revolutions and while the nozzle is moved with a constant velocity to traverse over the wafer so that the locus of the moving jetting hole and thus the locus of the point of collision of jetted water with the surface of the wafer passes the center of rotation of the wafer.

When pure water is jetted against a wafer under high pressure or at high velocity, static electricity arises where the pure water collides with the wafer. Especially according to the above-mentioned ultrasonic washing method or the washing method using cavitation-producing high-pressure water of the prior art, the center of rotation of the wafer is located under the locus of the shifting jetting hole for a longer period of time than the other portions of the wafer, because the apparatus is so constructed that pure water is jetted from a nozzle and the locus of the jetting hole of the nozzle passes the center of rotation of the wafer.

Therefore, when high-pressure pure water is jetted against the wafer or high-velocity pure water is jetted against the wafer by the ultrasonic washing method, a central portion of the wafer is exposed to collision with high-pressure or high-velocity pure water over a longer period of time than the other portions of the wafer. As a result, static electricity arises at a central portion of the wafer, thereby causing electrostatic breakage of electronic circuits at a surface part of the central portion of the wafer. Thus, short circuiting occurs and a defective product may be formed.

As a method of preventing the occurrence of static electricity mentioned above, there has been proposed a method of injecting carbon dioxide gas into ultra-pure water and thereby lowering a specific resistance of the ultra-pure water.

However, this method is extremely uneconomical and the apparatus therefor is complicated because the carbon dioxide originally present in the raw water must be first removed by passing the water through a decarbonater and an anion exchange resin tower with carbon dioxide thereafter being added again. In other words, there has so far been no effective method for preventing the occurrence of static electricity at the central portion of a wafer.

SUMMARY OF THE INVENTION

The present invention has been invented in view of the above-mentioned problems. It is an object of the present invention to prevent breakage of a superficial central portion of a workpiece during a process of washing. Especially when the workpiece is a wafer, it is an object of the present invention to prevent electrostatic breakage of electronic circuits on the surface of a central portion of the wafer which is caused by static electricity. It is another object of the present invention to provide a washing method and a washing apparatus devised so that an appropriate quantity of washing liquid comes into collision with the center of rotation of the workpiece and the entire surface of the workpiece is washed efficiently.

According to the present invention, the problem mentioned above is solved by designing a washing method and a washing apparatus so that, in the liquid jet washing step for shifting a nozzle while it stands opposite to the front or back surface of a rotating thin-plate-shaped workpiece and blowing a washing liquid from the nozzle against the workpiece to wash the workpiece, the locus of the shifting nozzle or the locus of the point of collision of the jetted water with the surface of the wafer is made not to pass through the center of rotation of the workpiece, and thereby the center of rotation is prevented from collision with the washing liquid over a longer period of time than the other portions of the workpiece and any electronic circuit present on the superficial central portion of the workpiece is prevented from electrostatic breakage caused by static electricity. At the same time, the method and the apparatus should be so designed that the locus of the shifting nozzle does not excessively separate from the center of rotation of the workpiece because the washing liquid must spread over the whole surface of the workpiece and the washing liquid must reach the center of rotation of the workpiece.

Further, according to the present invention, there is provided a liquid jet washing apparatus wherein a nozzle is made to shift while it stands opposite to the front or back surface of a rotating thin-plate-shaped workpiece, and a washing liquid is blown from the nozzle against the workpiece to wash the workpiece. This apparatus is so designed that the locus of the shifting nozzle or the locus of the point of collision of the jetted water with the surface of the wafer does not pass through the center of rotation of the workpiece, due to which the rotation center portion is prevented from collision with the washing liquid over a longer period of time than the other portions of the workpiece, and any electronic circuit present on the surface of central portion of the workpiece is prevented from electrostatic breakage caused by static electricity. At the same time, the apparatus should be designed so that the locus of the shifting nozzle does not excessively separate from the center of rotation of the workpiece because the washing liquid must spread over the whole surface of the workpiece and the washing liquid must reach the center of rotation of the workpiece.

The washing method of the present invention includes liquid jet washing, namely blowing a liquid jetted from a nozzle, which shifts while it stands or is positioned opposite to a front or back surface of a rotating thin-plate-shaped workpiece, against the workpiece, and thereby removing dust adhering to the surface of the aforesaid front or back surface and washing the workpiece, wherein the locus of the shifting nozzle or the locus of the point of collision of the jetted water with the surface of the wafer is so designed as to pass the vicinity of the center of rotation of the workpiece.

Preferably, the distance from the center of the jetted liquid on the surface of the washed surface to the above-mentioned center of rotation is made to fall in a range of from about 5 mm to about 7 mm as measured when the center of the liquid jetting hole of the nozzle shifting on the locus has reached a point closest to the center of rotation.

The washing apparatus according to the present invention includes a liquid jet washing mechanism for washing a thin-plate-shaped workpiece which jets a liquid from a nozzle shifting while it stands opposite the front or back surface of the workpiece, blows the liquid against the workpiece, removes dust adhering to the front or back surface thereof and thereby washes the workpiece. The locus of the shifting nozzle or the locus of the point of collision of the jetted water with the surface of the wafer is made to pass vicinity of the center of rotation of the workpiece.

Preferably, the distance from the center of the jetted liquid on the surface of the washed surface to the center of rotation is made to fall in a range of from about 5 mm to about 7 mm as measured when the center of the liquid jetting hole of the nozzle shifting on the locus has reached a point closest to the center of rotation.

Figure 1:
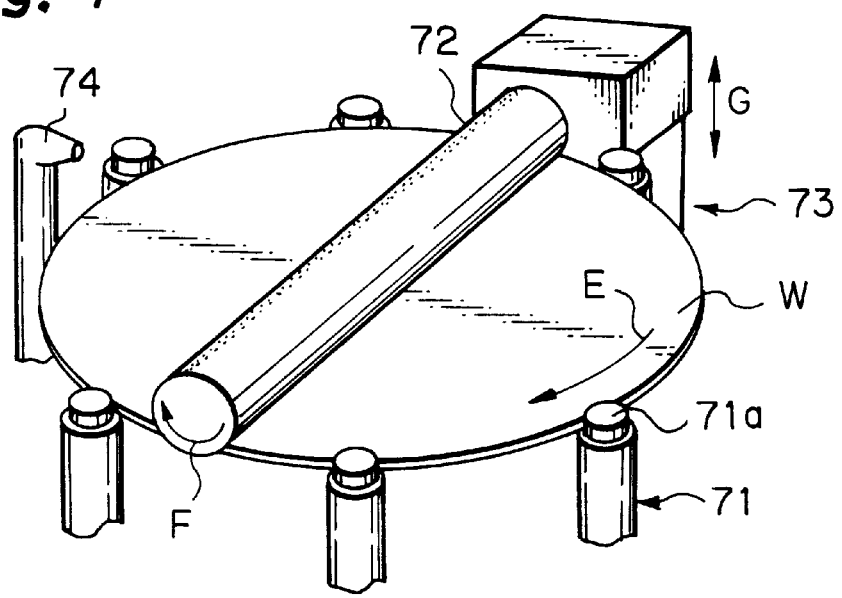
FIG. 1 is a perspective view illustrating a brush-washing apparatus according to an embodiment of the present invention.

In the drawings, W is a workpiece, 25 is an ultrasonic washing nozzle, 50 is a cavitation washing nozzle, 60 is a high-pressure jet washing nozzle, and 80 is a liquid jet washing mechanism.

PREFERRED EMBODIMENTS OF THE INVENTION

An embodiment of the present invention is explained with reference to the accompanying drawings. This embodiment is explained with regard to washing a semiconductor wafer as a workpiece. In this washing process, a semiconductor wafer having been polished is washed by a plurality of washing operations. The semiconductor wafer is successively conveyed from one washing apparatus to another by means of a robot or the like. Polishing of a surface of a semiconductor wafer is achieved by pressing such surface against a polishing cloth while supplying an abrasive fluid containing solid abrasive grains. Abrasive grains and scraps remaining in the fluid adhere to the polished wafer and the wafer is thus quite dirty in this state.

At least one of the aforesaid plurality of washing operations is liquid jet washing in which a liquid is jetted from a nozzle and blown against the semiconductor wafer to remove dust adherent to the front or back surface, thus to clean the workpiece.

As mentioned later, liquid jet washing is at least one operation selected from the group consisting of high-pressure water jet washing in which ultra-pure water is jetted at high pressure from a nozzle to effect washing, high-pressure water jet washing in which cavitation-producing ultra-pure water is jetted from a cavitation-generating nozzle to effect washing, and ultrasonic washing in which ultra-pure water to which vibration energy of ultrasonic waves has been imparted is jetted from a nozzle to effect washing, or a combination of these steps.

As depicted in FIG. 1, a brush washing apparatus is a type of scrubbing washing apparatus for use in a first washing operation and is provided with a plurality (six in FIG. 1) of spindles 71 for supporting the peripheral portion of a wafer W and rotating the wafer W, a brush arm 72 with a brush on the surface thereof, a brush-driving mechanism 73 for upwardly and downwardly moving the brush arm 72 as indicated by arrow G and rotating the brush arm 72 as indicated by arrow F, and a rinsing nozzle 74 for supplying a rinsing liquid (ultra-pure water) to the washed surface of the wafer W. Spindles 71 push tops 71a provided on upper portions thereof against the peripheral portion of the wafer W and rotate the tops 71a to rotate the wafer W. Of the six tops 71a, two provide rotating power to the wafer W, and the other four tops 71a function as bearings supporting the rotation of the wafer W. Moving brush arm 72 down until it comes into contact with the surface wafer W, jetting rinsing fluid (ultra-pure water) from rinsing nozzle 74 against the surface of wafer W, and rotating the wafer W and brush arm 72 causes the wafer W to be washed.

Figure 2:
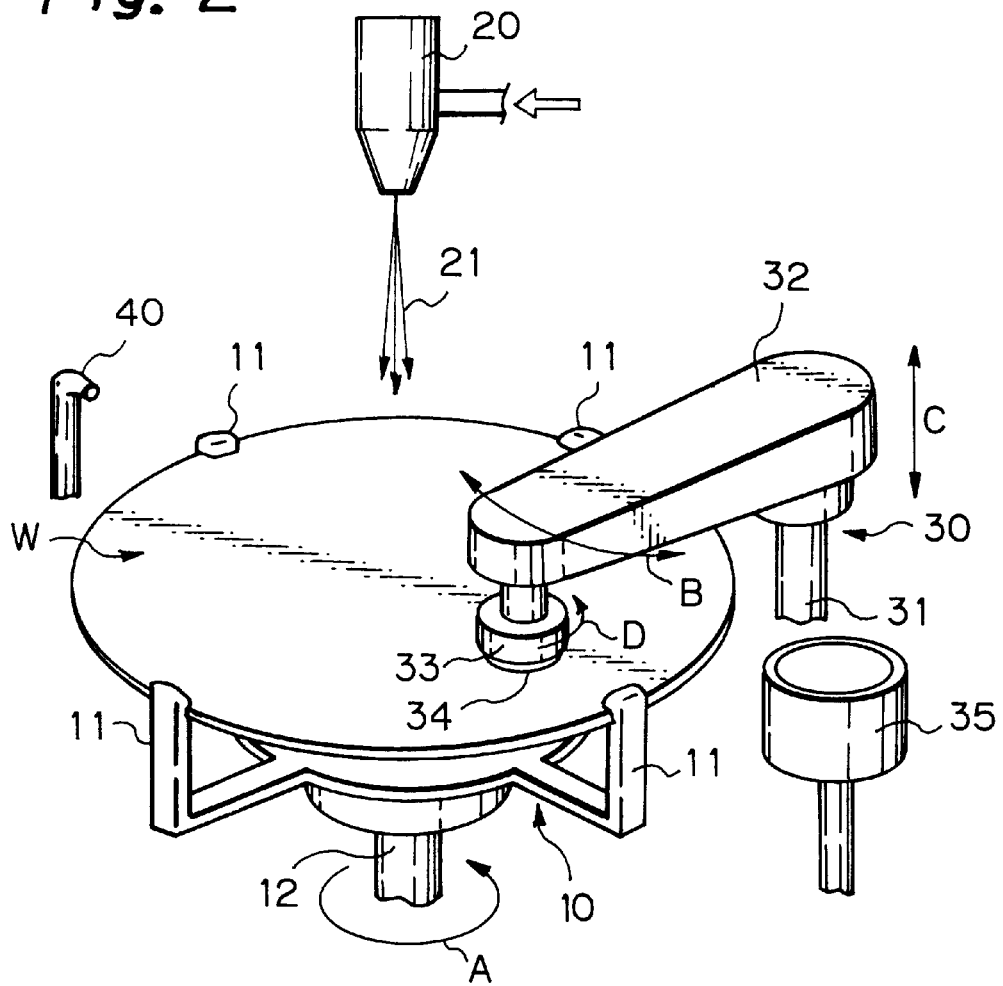
FIG. 2 is a perspective view illustrating a sponge-washing apparatus according to an embodiment of the present invention.

After washing using the brush washing apparatus mentioned above, the wafer W is conveyed by means of a robot (not depicted in FIG. 1) to a scrubbing washing apparatus for a second washing operation depicted in FIG. 2, which constitutes a second portion of the washing process. In FIG. 2, a rotary chuck 10 rotates around axis 12 in the direction indicated by arrow A, while holding the peripheral portion of a semiconductor wafer W between arms 11. A liquid jet washing nozzle 20 is constructed to jet fluid 21 against the polished surface of the semiconductor wafer W. A scrubbing washing apparatus 30 includes an arm 32 supported by a shaft 31 and a sponge-fitting portion 33 provided on the tip of the arm 32. As indicated by arrow C, the shaft 31 can move upwardly and downwardly, and the arm 32 supported by the shaft 31 can move upwardly and downwardly together with shaft 31 and at the same time can rotate or pivot together with rotation of shaft 31 as indicated by arrow B. A sponge 34 is attached to the sponge-fitting portion 33, and a sponge container 35 is provided for containing the sponge-fitting portion 33 when the scrubbing washing apparatus 30 is not in operation. The sponge-container 35 has a cup-like shape and contains pure water. A rinsing nozzle 40 supplies rinsing liquid onto the semiconductor wafer W.

Semiconductor wafer W is set to the washing apparatus of the above-mentioned construction so that the washed surface of semiconductor wafer W faces upward and the entire semiconductor is held between the arms 11 of rotary chuck 10. While rotating the rotary chuck 10 in the direction of arrow A, ultra-pure water 21 is jetted from the liquid jet washing nozzle 20 onto the upside or upper surface of semiconductor wafer W to wash off the abrasive grains and scraps remaining on such surface. Thereafter, shaft 31 is elevated to lift the sponge-fitting portion 33 placed in the sponge container 35 together with arm 32, further the arm 32 is rotated in the direction of arrow B, the shaft 31 is lowered to push the sponge 34 against the upside surface of semiconductor wafer W, and the sponge-fitting portion 33 is rotated in the direction of arrow D. At this time, the arm 32 is swung around the axis 31 and at the same time the rotary chuck 10 is rotated, so that the sponge 34 rubs the upside surface of semiconductor wafer 34. Rinsing fluid (ultra-pure water) is jetted from the rinsing nozzle 40 to wash away abrasive grains and scraps.

After the above-mentioned washing using the scrubbing washing apparatus, liquid jet washing is provided as a third operation of the washing process, whereby liquid jetted from a nozzle is blown against wafer W to wash the wafer. The wafer W having been washed with the above-mentioned scrubbing washing apparatus is fed by means of a robot, not shown, to the liquid jet washing apparatus 80 for use in the liquid jet washing operation depicted in FIGS. 3 and 4. In this washing apparatus, pure water 21 is jetted from liquid jet washing nozzle 25 onto the upper surface of the wafer W to wash away the abrasive grains and scraps remaining on such surface. Thus, in FIGS. 3 and 4, the wafer W is held horizontally and in a rotative manner by means of the same rotary chuck 10 as in FIG. 2. A nozzle 25 with a pure water-jetting hole pointed toward the surface of the wafer W is supported by an arm 25*a* which can be rotated by a rotating axis or shaft 25*b*. The nozzle 25 is rotated together with shaft 25*b* and shifted so as to once cross the upper surface of the wafer W with a constant rotating velocity from the bottom to the top relative to FIG. 4, while rotating the wafer W and jetting pure water 21 from the nozzle 25 against the upside surface of the wafer W. The invention is not limited to such embodiment in which the nozzle 25 is shifted so as to once cross the upper space of the wafer W, but the invention includes other embodiments also, such as an embodiment in which the nozzle 25 performs a reciprocating motion over the wafer W while jetting pure water toward the upside surface of the wafer W, and an embodiment in which the nozzle 25 is shifted so as to cross the upside space of the wafer W once from top to bottom relative to FIG. 4 while jetting the pure water toward the upside surface of the wafer W.

Figure 4:
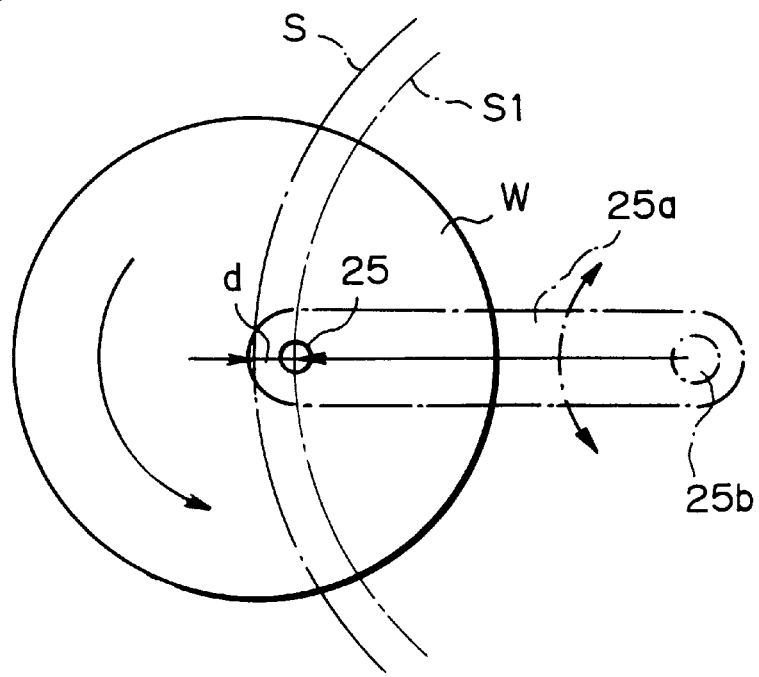
FIG. 4 is a plan view illustrating main part of the liquid-jet washing apparatus according to an embodiment of the present invention.

In FIG. 4, the locus of the center of the liquid jetting hole of the shifting nozzle 25, that is, the center of the jetted liquid on the washed surface is represented by S1, i.e. a locus as viewed from above the wafer W, and the apparatus is so designed that the center of the liquid jetting hole of the nozzle 25 or the center of the jetted liquid on the washed surface passes a point spaced from the center of rotation of the wafer W when the center of the liquid jetting hole has reached a point closest to the center of rotation of the wafer. That is, the locus of shifting of the center of the liquid jetting hole of the nozzle 25 or the locus of the point of collision of the jetted water with the surface of the wafer must not pass over the center of rotation of the wafer W in order to prevent the center of rotation of the wafer W from colliding with the washing liquid over a longer period of time than the other portions of the wafer. At the same time, an appropriate quantity of washing liquid must collide with the center of rotation of the wafer, and therefore the locus of shifting of the center of the liquid jetting hole of the nozzle 25 must not be excessively spaced from the center of rotation of wafer W, because the washing liquid must collide with the entire surface of the wafer.

According to an experiment, when effecting washing while jetting cavitation-producing ultra-pure water or when effecting washing while jetting high-velocity ultra-pure water endowed with ultrasonic vibration energy, and if a diameter of the liquid jetting hole is 5 mm to 10 mm and the total amount of washing liquid is 0.8 to 2.0 liter/minute, the most preferable distance d satisfying these two conditions was in the range of from 5 mm to 7 mm. However, the two conditions were sufficiently satisfied when distance d is selected as defined by $q/2<d<2q$, where q is a diameter of the liquid jetting hole of the nozzle. Under such condition, no short circuiting due to electrostatic breakage took place in the central portion of wafer W, either when effecting washing while jetting high-pressure ultra-pure water from nozzle 25, effecting washing while jetting cavitation-producing ultra-pure water or effecting washing while jetting high-velocity ultra-pure water endowed with ultrasonic vibration energy. In these cases, the jetted washing liquid washes the central portion of the wafer due to the fact that, although the jetted liquid before collision does not pass over the central portion of the wafer with no washing effect on the central portion of the wafer, the jetted liquid after collision, which causes less static electricity flows in the central portion of the wafer and washes such portion. For reference, FIG. 4 illustrates the locus of shifting of the pure-water jetting hole in the prior art as one-dotted chain lines S. As shown by S, the locus of shifting of the center of the pure-water jetting hole in the prior art passes over the center of rotation of the wafer.

Figure 3:
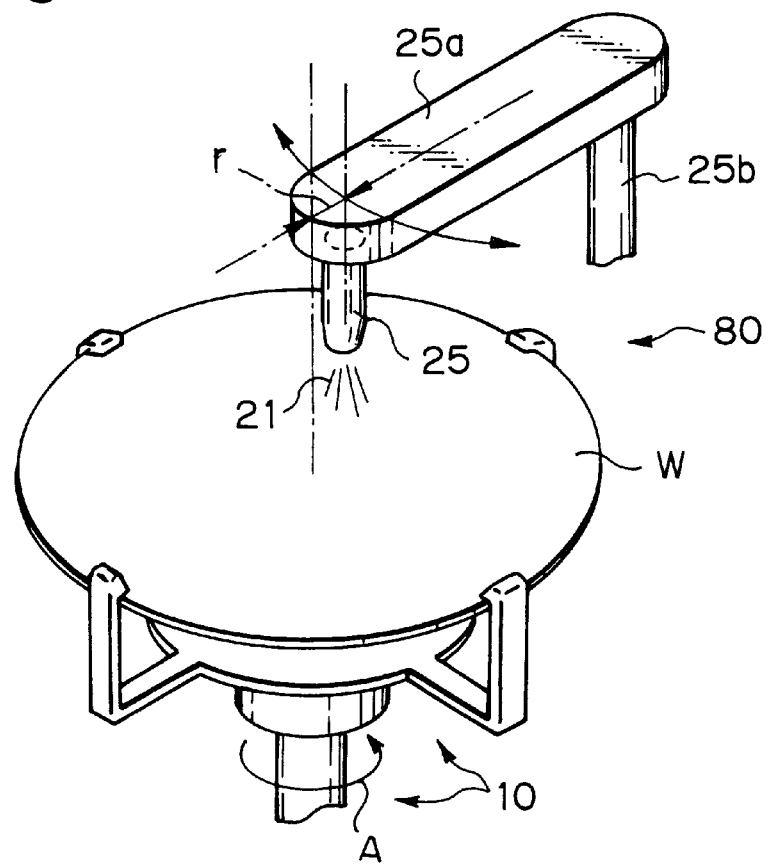
FIG. 3 is a perspective view illustrating a liquid-jet washing apparatus according to an embodiment of the present invention.
Figure 5:
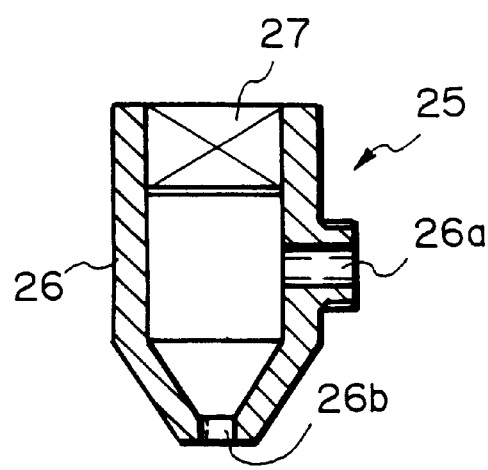
FIG. 5 is a sectional view illustrating an ultrasonic washing nozzle according to an embodiment of the present invention.

FIG. 5 illustrates the structure of an ultrasonic washing nozzle for use as the liquid jet washing nozzle 25 of FIG. 3. The ultrasonic washing nozzle 25 is constructed such that an ultrasonic vibrator 27 is provided at the rear end of a main body of nozzle 26. By starting the ultrasonic vibrator 27 and injecting high pressure ultra-pure water from injection hole 26*a*, ultrasonic energy is imparted to the ultra-pure water, and ultra-pure water having acquired the ultrasonic energy is jetted to the upper surface of the wafer from jetting hole 26*b*, by which such energy is transmitted indirectly to dust adhering to the upper surface of a wafer through the intermediary of the jetted ultra-pure water. As a result, dust vibrates and peels from the surface of wafer and is washed away by the jetted ultra-pure water. By using an ultrasonic washing nozzle in the above-mentioned manner, it is possible to decrease the amount of dust. In a wafer W having a diameter of 8 inches, dust having a diameter of 1 micron or above which amounts to several hundred thousands of particles just after completion of polishing can be decreased to a level of from several ten thousands to several thousands of particles. The ultrasonic wave used in this ultrasonic washing treatment vibrates at around 1.0 MHz.

Figure 6:
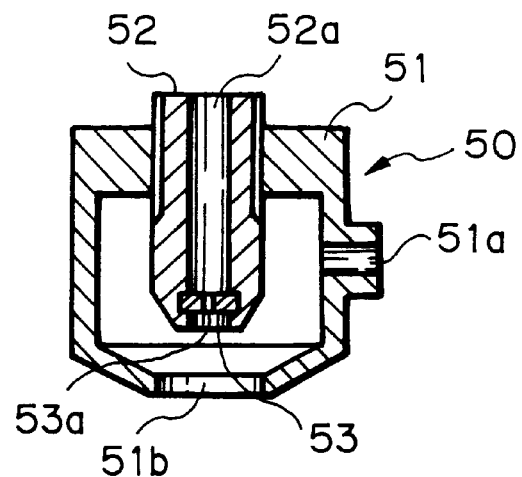
FIG. 6 is a sectional view illustrating a cavitation washing nozzle according to an embodiment of the present invention.

FIG. 6 illustrates the structure of a cavitation washing nozzle that can be used in the liquid jet washing apparatus of FIG. 3 in place of the ultrasonic washing nozzle 25. Such cavitation washing nozzle is so constructed that cavitation-producing high-pressure water is jetted from the nozzle to effect washing. The cavitation washing nozzle 50 is equipped with a low pressure nozzle 51 and a high-pressure nozzle 52, wherein the tip of the high-pressure nozzle 52 is inserted into the framework of the low pressure nozzle 51. In the low pressure nozzle 51, there are formed an injection hole 51*a* for injecting a low-pressure washing liquid and a jetting hole 51*b* for jetting the washing liquid. In the high pressure nozzle 52, there is formed an injection hole 52*a* for injecting a high-pressure washing liquid. The tip of nozzle 52 has a jetting cap 53, having in a central portion thereof a jetting hole 53*a*. When a low-pressure washing liquid (ultra-pure water) of about 1 to 2 Kg/cm$^2$ is injected from the injection hole 51*a* of the low pressure nozzle 51 and at the same time a high-pressure washing liquid (ultra-pure water) of about 30 to 150 Kg/cm$^2$ is injected from the injection hole 52*a* of high pressure nozzle 52 in the cavitation washing nozzle 50 of the above-mentioned structure, a high velocity jet flow is jetted from the jetting hole 53*a* of the jetting cap 53 and passes through the low velocity jet flow jetted from the jetting hole 51*b*. Since there is a velocity difference between the low velocity jet flow and the high velocity jet flow, cavitation is generated at the interface between the two jet flows. If the surface of the wafer W is located at position at which the formed cavitation breaks, namely if the position of cavitation washing nozzle 50 is adjusted so that the cavitation breaks at the surface of wafer W, the energy of breakage of cavitation is imparted to the dust, and the dust is peeled off from the surface of a wafer W. The cavitation washing process mentioned above is known to have the ability to remove dust having a size in the range of submicrons. In a wafer W having a diameter of 8 inches, the amount of dust having a diameter of 0.2 micron or above can be decreased by this cavitation washing method from a level of several tens of particles to a level of several particles.

Figure 7:
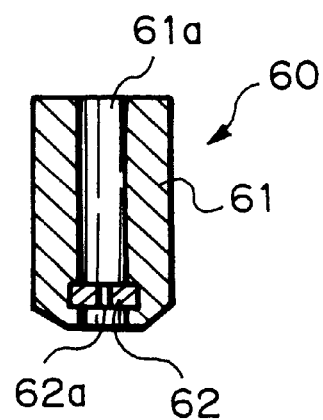
FIG. 7 is a sectional view illustrating a high-pressure jet washing nozzle according to an embodiment of the present invention.

FIG. 7 illustrates the structure of a high-pressure jet washing nozzle used in the liquid jet washing apparatus of FIG. 3, in place of the ultrasonic washing nozzle 25 of FIG. 5. The high pressure jet washing nozzle 60 is so constructed that a main body 61 of nozzle 60 is provided with an injection hole 61*a* for injecting a washing liquid of high pressure, the tip of the injection hole 61*a* has a jetting cap 62, and a jetting hole 62*a* having a small diameter is formed in the central portion of the jetting cap 62. If high pressure ultra-pure water is injected into the injection hole 61*a*, the jetting hole 62*a* of the jetting cap 62 squeezes the ultra-pure water to form a high-velocity flow having a jetting velocity of several tens of m/s at the outlet thereof. The high-velocity ultra-pure water collides against the surface of the wafer W, and the impact force peels away dust from the surface of the wafer W. The dust thus peeled off is removed from the wafer W together with the pure water.

The present invention is not limited to the embodiments mentioned above, and a variety of modifications are contemplated. For instance, although the embodiments presented above are explained with reference to washing a semiconductor wafer W, it is also possible to apply the washing method and washing apparatus of the present invention to the washing of LCDs, or the like. In FIG. 1, two of the six tops 71*a* provide rotating power to wafer W, and the other four tops 71*a* function as bearings supporting the rotation of wafer W. However, the invention is not limited to such an embodiment, but it is also possible that all of the six tops 71*a* provide rotating power to wafer W.

Further, although ultra-pure water is jetted only against the upper surface of the wafer in FIG. 3 in the embodiments presented above, a construction in which ultra-pure water is jetted against only the lower surface of a wafer is also possible. In such a case, the apparatus is so constructed that the pure water jetting hole of the nozzle is positioned opposite the downside or lower surface of the wafer and the nozzle is swung in the same manner as in FIG. 3. It is also possible to construct the apparatus so that ultra-pure water is jetted from separate nozzles against both the upper and lower surfaces of a wafer.

Although the nozzle is swung (rotated) in a horizontal plane (the axis of rotation is vertical) in the above embodiments, the construction is not limited thereto, but a construction in which the nozzle is inclined to the vertical, or in which the axis of rotation of the nozzle is inclined to the vertical, also is possible. In such case, the apparatus may be so constructed that the locus of the center of the contacting portion between the wafer and the washing liquid flow injected from the nozzle and inclined to the vertical direction is spaced from the rotation center of the wafer.

In the embodiment presented above, the liquid jet washing operation step is any one operation selected from operations using the nozzles of FIGS. 5 to 7 as the nozzle of FIG. 3. However, the present invention is not limited thereto, but the liquid jet washing operation may be a combination of a plurality of operations selected from the above-mentioned high-pressure water jet washing operation, the washing operation using a jet of cavitation-producing high-pressure water and the ultrasonic washing operation. For instance, in one contemplated embodiment, three apparatuses which are all the same as that of FIG. 3 are arranged in series, except that the nozzles therefor are changed so that the nozzles for the first, second and third apparatuses are those of FIGS. 5, 6 and 7, respectively, and a wafer is washed by these three liquid jet washing operations successively. Further, in another contemplated embodiment, instead of providing three apparatuses as above, three movable arms are provided around a common rotary chuck, and the nozzles of FIGS. 5 to 7 are provided on the respective arms, so that each nozzle moves and alternately comes to a position opposite the upper surface of a wafer, and the wafer can be washed with the nozzles of FIGS. 5 to 7 successively. In yet another embodiment, the nozzle of FIG. 3 is successively exchanged from one to another selected from the nozzles of FIGS. 5 to 7, so that the wafer can be washed with the nozzles of FIGS. 5 to 7 successively.

As to the locus of shifting of the nozzle, the object of the invention can be achieved when the washing liquid collides with the entire surface of a wafer as a result of a co-operative action of rotating the wafer and the shifting nozzle, and rotation of the nozzle is not necessary. For instance, the nozzle may make a straight movement, or it may move on a curved locus instead of being revolved. Further, it is unnecessary that the nozzle crosses the space over the wafer completely but, for instance, the nozzle may move from outside of the wafer to the space over the wafer and, when the nozzle has reached adjacent the center of rotation of the wafer, it may return the original position.

In the present invention, a simple structure wherein the shifting velocity of the nozzle is constant may prevent excessive injection of the washing liquid to the center of the wafer. Although the shifting velocity of the nozzle is constant in the above embodiment, the shifting velocity of the nozzle over the wafer may vary along the locus of motion. Preferably, the shifting velocity is high at the central portion of the wafer W and gradually decreases as it moves to the peripheral portion of the wafer so that the time of the injected washing liquid contacting with the central portion of the wafer W is shortened further.

In the present embodiment, the first and second washing operations using a brush arm and a sponge are provided as pre-stages of the liquid jet washing operation. However, the invention is not limited thereto, but three or more washing operations may be provided as pre-stages of the liquid jet washing operation. For instance, use of a double sided washing apparatus may be provided as a prestage of the liquid jet washing operation. A double-sided washing apparatus may be a structure in which a brush arm of FIG. 1 and a sponge of FIG. 2 are positioned opposite to the downside or lower surface and the upside or upper surface, respectively, of a wafer. Also, the structure may have brush arms of FIG. 1 positioned opposite to the upside and downside surfaces of a wafer. A combination of these washing apparatuses and the apparatuses of FIGS. 1 and 2 providing a multistage washing apparatus is also contemplated, and can wash a wafer more cleanly.

As to the wafer rotation mechanism of FIGS. 1 and 2, a rotating apparatus using rotary chuck 10 of FIG. 2 may be employed in FIG. 1, or a rotating apparatus using the spindles 71 of FIG. 1 may be employed in FIG. 2. Further, in the liquid jet washing operation, the apparatus for retaining the wafer horizontally and rotating it is not limited to that of the present disclosure, but the structure using a spindle as shown in FIG. 1 also may be employed.

The washing liquid may be a surface active agent or an alkaline or acid liquid as well as pure water. The shape of the cross-section of the nozzle may be an ellipse or polygonal shape as well as a circular shape used in the illustrated embodiment of the invention.

In the liquid jet washing operation of the present invention which comprises shifting a nozzle while it is opposite to a front or back surface of a rotating thin-plate-shaped workpiece and jetting a washing liquid from the nozzle against the workpiece to wash the workpiece, the locus of the shifting nozzle is caused to not pass over the center of rotation of the workpiece. Thereby the portion of the wafer surface at the center of rotation is prevented from being collided by the washing liquid for a longer period of time than the other portions of the workpiece, even when the nozzle shifts at constant velocity over the wafer. At the same time the locus of the shifting nozzle is prevented from becoming excessively spaced from the center of rotation of the wafer or workpiece.

Thus, the surface of the central portion of the workpiece is prevented from breakage and, especially when the workpiece is a wafer, the occurrence of electrostatic breakage caused by static electricity in the electronic circuit on the surface of the central portion of the wafer is prevented. Further, since an appropriate quantity of washing liquid collides also against the center of rotation of the workpiece, the washing liquid washes the entire surface of the workpiece, and washing can be effected satisfactorily.

Further, in the liquid jet washing apparatus of the present invention which comprises shifting a nozzle while it is positioned opposite to a front or back surface of a rotating thin-plate-shaped workpiece and jetting a washing liquid from the nozzle against the workpiece to wash the workpiece, the locus of the shifting nozzle is caused to not pass over the center of rotation of the workpiece. Thereby, the rotating center portion is prevented from collision with the washing liquid over a longer period of time than the other portions of the workpiece, and at the same time the locus of the shifting nozzle is prevented from being excessively spaced from the center of rotation of the workpiece.

Thus, the surface of central portion of the workpiece is prevented from breakage and, especially when the workpiece is a wafer, the occurrence of electrostatic breakage caused by static electricity in the electronic circuit on the surface of the central portion of the wafer is prevented. Further, since an appropriate quantity of washing liquid collides against the center of rotation of the workpiece, the washing liquid collides also against the entire surface of the workpiece, and washing can be effected satisfactorily.

What is claimed is:

1. A method of washing a thin plate-shaped workpiece, said method comprising:

rotating said workpiece about a center of rotation;

positioning a liquid jet nozzle to confront a surface of said workpiece;

moving said nozzle across said surface along a locus passing in the vicinity of said center of rotation and not over said center of rotation; and jetting liquid from said nozzle toward said surface, thereby removing dust adhering to said surface and washing said workpiece.

2. A method as claimed in claim 1, further comprising controlling said locus such that, when a center of a liquid jetting hole of said nozzle is closest to said center of rotation, a center of jetted liquid contacting said surface is spaced from said center of rotation by a distance d of from about 5 mm to about 7 mm.

3. A method as claimed in claim 2, wherein said distance d is in a range of $q/2<d<2q$, wherein q is a diameter of said liquid jetting hole.

4. An apparatus for washing a thin plate-shaped workpiece that is rotating about a center of rotation, said apparatus comprising:

a liquid jet nozzle positionable to confront a surface of the workpiece and to jet liquid toward the surface of the workpiece; and a mechanism to move said nozzle across the surface in a locus to pass in the vicinity of the center of rotation of the workpiece and not over the center of rotation, whereby the liquid jetted by said nozzle removes dust adhering to the surface of the workpiece and washes the workpiece.

5. An apparatus as claimed in claim 4, wherein said mechanism is operable to control said locus such that, when a center of a liquid jetting hole of said nozzle is closest to the center of rotation, a center of jetted liquid contacting the surface is spaced from the center of rotation by a distance d of from about 5 mm to about 7 mm.

6. An apparatus as claimed in claim 5, wherein said distance d is in a range of $q/2<d<2q$, wherein q is a diameter of said liquid jetting hole.

7. An apparatus as claimed in claim 4, further comprising a mechanism for supporting the workpiece and rotating the workpiece about the center of rotation.

* * * * *